(12) United States Patent
Ochi et al.

(10) Patent No.: US 11,270,605 B2
(45) Date of Patent: Mar. 8, 2022

(54) ORGANIC EL DISPLAY DEVICE

(71) Applicant: Sharp Kabushiki Kaisha, Sakai (JP)

(72) Inventors: Takashi Ochi, Sakai (JP); Mamoru Ishida, Sakai (JP); Tohru Sonoda, Sakai (JP); Tohru Senoo, Sakai (JP); Takeshi Hirase, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/895,066

(22) Filed: Jun. 8, 2020

(65) Prior Publication Data

US 2020/0302834 A1    Sep. 24, 2020

Related U.S. Application Data

(62) Division of application No. 16/301,944, filed as application No. PCT/JP2017/025789 on Jul. 14, 2017, now Pat. No. 10,726,748.

(30) Foreign Application Priority Data

Jul. 21, 2016 (JP) ................... 2016-143603

(51) Int. Cl.
| | |
|---|---|
| *G09F 9/30* | (2006.01) |
| *H05B 33/02* | (2006.01) |
| *H01L 51/00* | (2006.01) |
| *H01L 27/32* | (2006.01) |
| *H01L 51/50* | (2006.01) |

(Continued)

(52) U.S. Cl.
CPC .......... *G09F 9/301* (2013.01); *H01L 27/3241* (2013.01); *H01L 51/0097* (2013.01); *H01L 51/5012* (2013.01); *H05B 33/02* (2013.01); *H01L 27/1244* (2013.01); *H01L 27/32* (2013.01); *H01L 27/3244* (2013.01); *H01L 51/5246* (2013.01); *H01L 2251/5338* (2013.01)

(58) Field of Classification Search
CPC . G09F 9/301; H01L 51/0097; H01L 27/3241; H01L 51/5012; H01L 2251/5338; H01L 51/5246; H01L 27/3244; H01L 27/32; H01L 27/1244; H05B 33/02; Y02E 10/549

See application file for complete search history.

(56) References Cited

U.S. PATENT DOCUMENTS

| | | | |
|---|---|---|---|
| 2013/0093308 A1* | 4/2013 | Kagotani | F21V 29/74 313/45 |
| 2015/0177789 A1* | 6/2015 | Jinbo | G06F 1/1652 313/511 |

(Continued)

OTHER PUBLICATIONS

Ochi et al., "Organic El Display Device", U.S. Appl. No. 16/301,944, filed Nov. 15, 2018.

*Primary Examiner* — Patricia D Valenzuela
(74) *Attorney, Agent, or Firm* — Keating & Bennett, LLP

(57) ABSTRACT

A display device includes: a display panel which is flexible, and including a pair of flat portions held in a flat state, and a bending portion provided between the pair of the flat portions and held to be bendable; a first support supporting one of the pair of the flat portions in a flat state; a second support supporting the other of the pair of the flat portions in a flat state; and a joint joining the first support and the second support together. The joint is flexible and provided not to interfere with the bending portion.

14 Claims, 10 Drawing Sheets

(51) Int. Cl.
*H01L 51/52* (2006.01)
*H01L 27/12* (2006.01)

(56) References Cited

U.S. PATENT DOCUMENTS

2015/0207102 A1* 7/2015 Jeong .................. H04M 1/0268
            257/40
2017/0367198 A1* 12/2017 Park .................... H01L 51/5237

* cited by examiner

ORGANIC EL DISPLAY DEVICE

TECHNICAL FIELD

The present invention relates to an organic EL display device.

BACKGROUND ART

Self-luminous organic EL display devices including an organic electroluminescence (EL) element have recently received attention, as display devices alternative to liquid crystal display devices. As an organic EL display device of this type, a repeatedly bendable organic EL display device including a flexible resin substrate, and an organic EL element and various kinds of films stacked on the resin substrate has been proposed.

For example, Patent Document 1 discloses a display device including: a flexible display panel such as, so-called, an organic EL display panel; a pair of housings on which the display panel is laid; and a hinge pivotably joining the pair of housings together. When the pair of housings pivots, the display device folded is opened flat for use.

CITATION LIST

Patent Documents

PATENT DOCUMENT 1: Japanese Unexamined Patent Publication No. 2013-50547

SUMMARY OF THE INVENTION

Technical Problem

As the display device disclosed in Patent Document 1, an organic EL display device having an organic EL display panel secured to a pair of housings joined together with a hinge mechanism is likely to create distortion between the pair of housings because of such reasons as poor finishing accuracy of the hinge mechanism. Here, since the flexible organic EL display panel is in the form of a thin film (for example, approximately 100 μm thick), even if the distortion created between the pair of housings is as slight as several tens of micrometers, wrinkles are inevitably formed on a bendable bending portion, of the organic EL display panel, positioned between the pair of housings.

The present invention is conceived in view of the above problems, and attempts to reduce formation of wrinkles on a bending portion of an organic EL display panel.

Solution to the Problem

In order to achieve the above object, an organic EL display device according to the present invention includes: an organic EL display panel which is flexible, the organic EL display panel including a pair of flat portions held flat, and a bending portion provided between the pair of the flat portions and held to be bendable; a first support supporting one of the pair of the flat portions in a flat state; a second support supporting the other one of the pair of the flat portions in a flat state; and a joint joining the first support and the second support together, wherein the joint is flexible and provided not to interfere with the bending portion.

Advantages of the Invention

According to the present invention, the joint joins together the first support supporting one of the pair of the flat portions and the second support supporting the other of the pair of the flat portions. The joint is flexible and provided not to interfere with the bending portion of the organic EL display panel, reducing formation of wrinkles on a bending portion of the organic EL display panel.

DESCRIPTION OF EMBODIMENTS

Embodiments of the present invention will now be described in detail with reference to the drawings. Note that the present invention is not limited to the following embodiments.

First Embodiment

Figure 1:
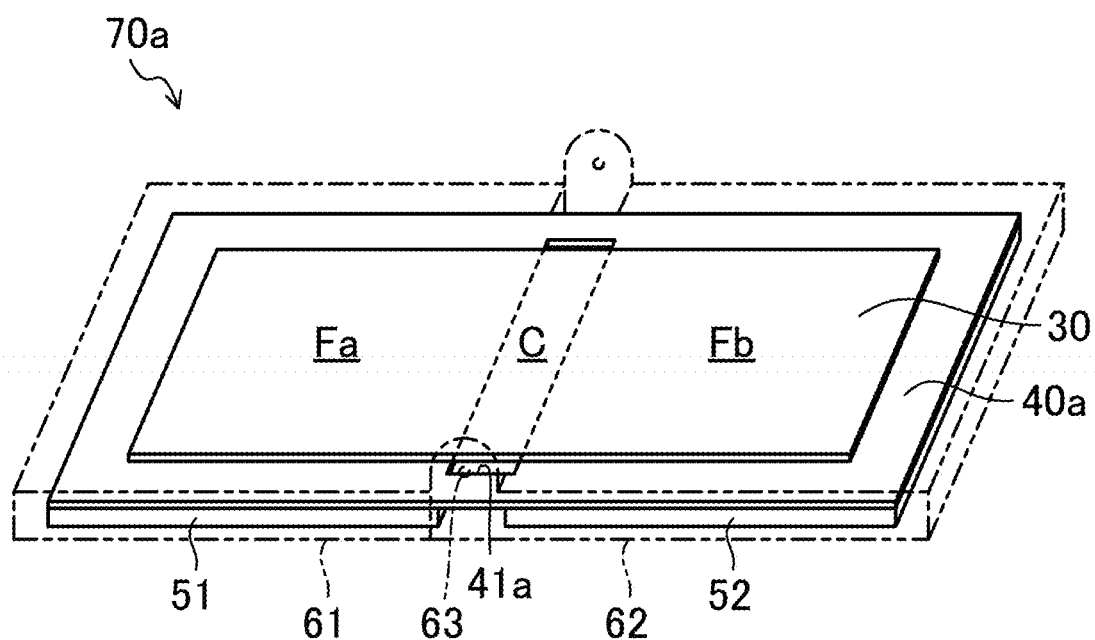
FIG. 1 is a perspective view of an organic EL display device in an open state according to a first embodiment of the present invention.
Figure 2:
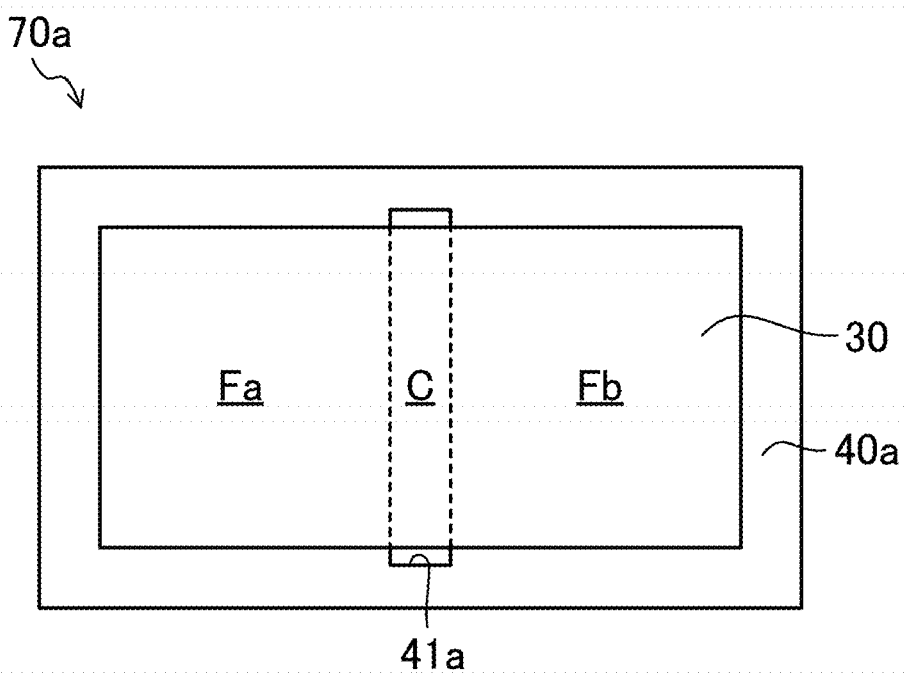
FIG. 2 is a top view of the organic EL display device in the open state according to the first embodiment of the present invention.
Figure 3:
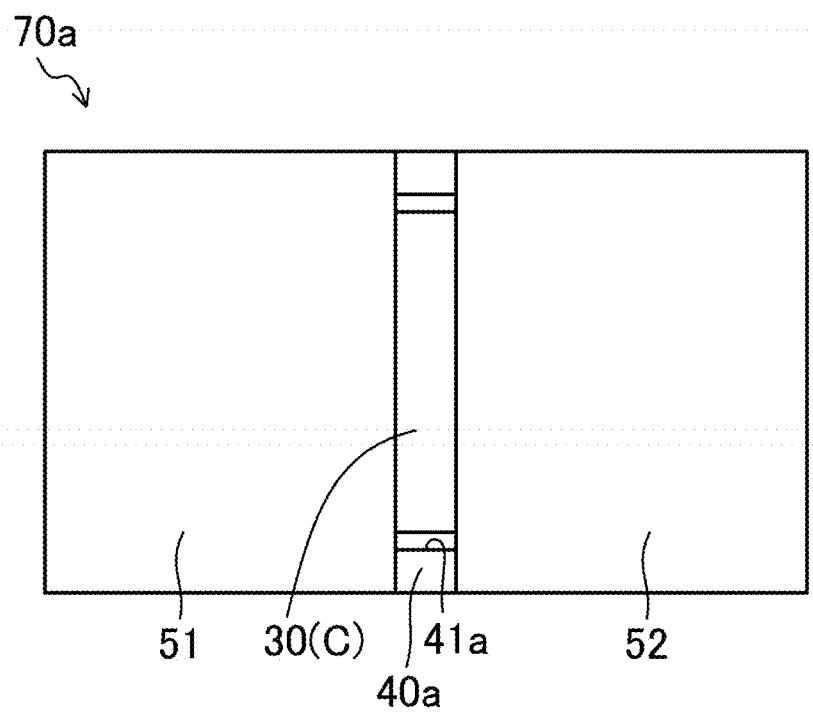
FIG. 3 is a bottom view of the organic EL display device in the open state according to the first embodiment of the present invention.
Figure 4:
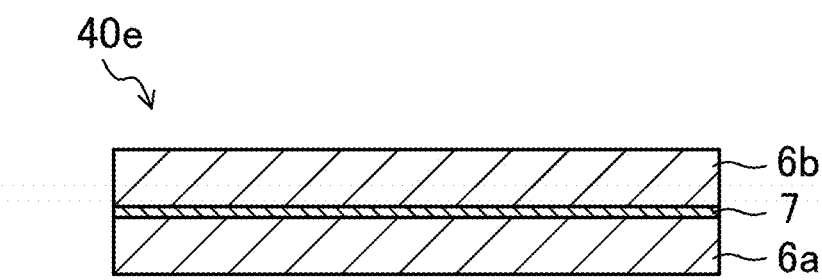
FIG. 4 is a cross-sectional view of a modification of a plate member included in the organic EL display device according to the first embodiment of the present invention.
Figure 5:
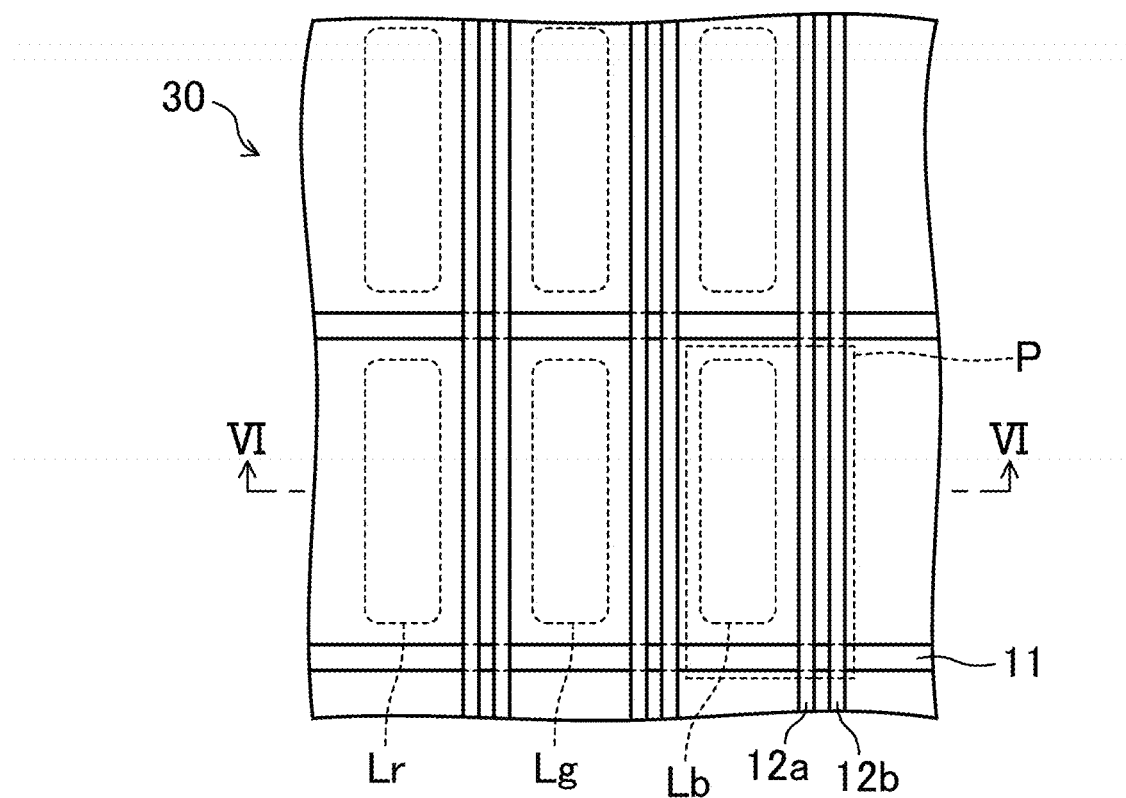
FIG. 5 is a plan view illustrating a pixel structure of an organic EL display panel included in the organic EL display device according to the first embodiment of the present invention.
Figure 6:
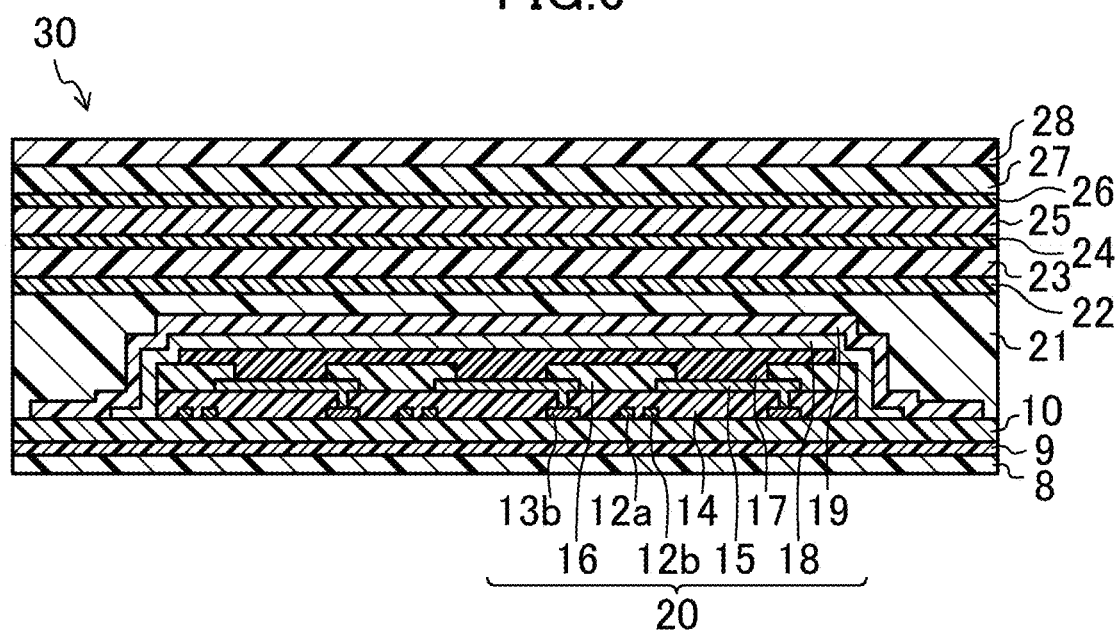
FIG. 6 is a cross-sectional view of the organic EL display panel taken from line VI-VI of FIG. 5.
Figure 7:
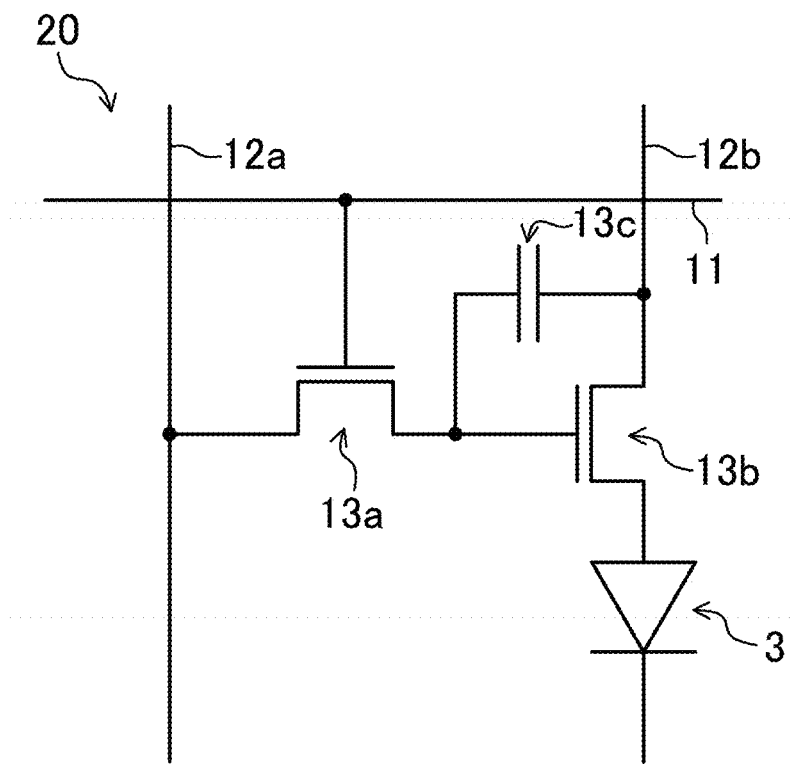
FIG. 7 is an equivalent circuit diagram of an organic EL element layer included in the organic EL display panel of the organic EL display device according to the first embodiment of the present invention.
Figure 8:
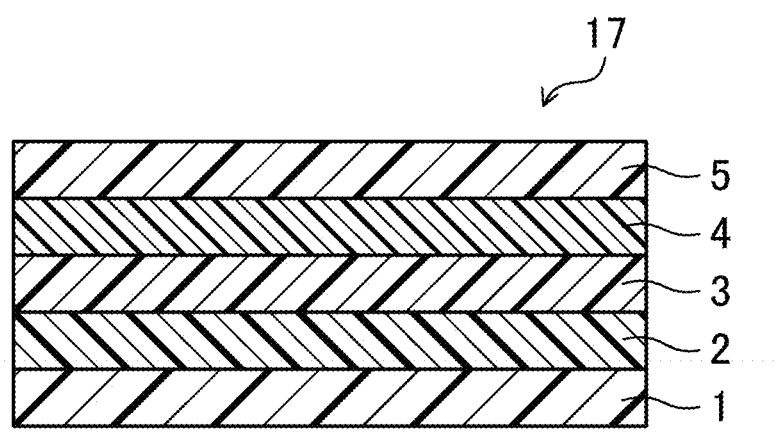
FIG. 8 is a cross-sectional view of the organic EL element layer included in the organic EL display panel of the organic EL display device according to the first embodiment of the present invention.
Figure 9:
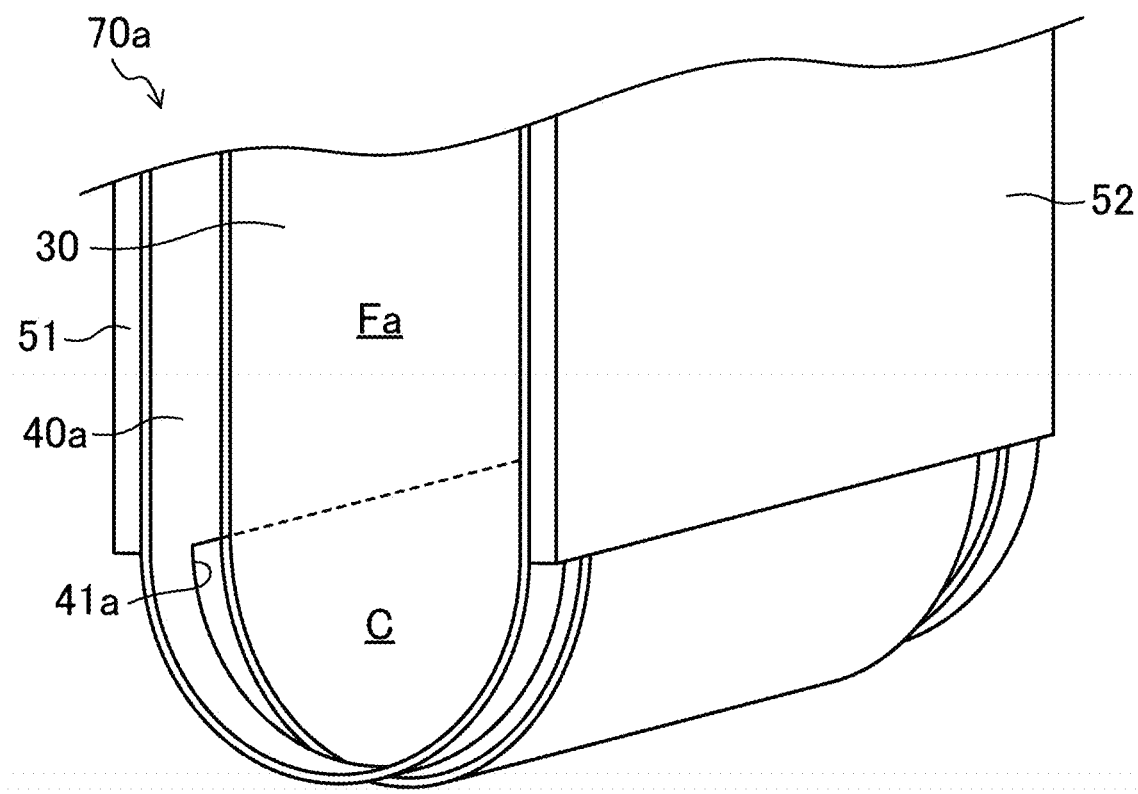
FIG. 9 is a perspective view of the organic EL display device in a folded state according to the first embodiment of the present invention.
Figure 10:
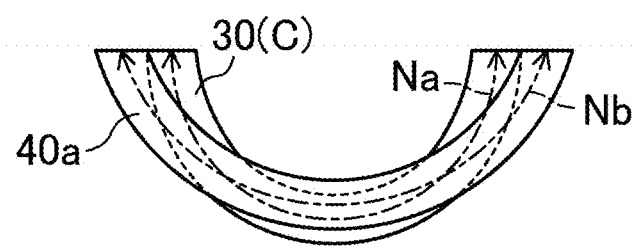
FIG. 10 is a side view explaining a neutral plane of a bending portion of the organic EL display panel, in the folded state, of the organic EL display device according to the first embodiment of the present invention.

FIGS. 1 to 10 illustrate an organic EL display device according to a first embodiment of the present invention. FIGS. 1, 2, and 3 are a perspective view, a top view, and a bottom view of an organic EL display device 70a, in an open state, of this embodiment. FIG. 4 is a cross-sectional view of a plate member 40e, which is a modification of a plate member 40a included in the organic EL display device 70a. FIG. 5 is a plan view illustrating a pixel structure of an organic EL display panel 30 included in the organic EL display device 70a. FIG. 6 is a cross-sectional view of the organic EL display panel 30 taken from line VI-VI of FIG. 5. FIG. 7 is an equivalent circuit diagram of an organic EL element layer 20 included in the organic EL display device 30. FIG. 8 is a cross-sectional view of an organic EL layer 17 included in the organic EL display device 30. FIG. 9 is a perspective view of the organic EL display device 70a in a folded state. FIG. 10 is a side view explaining a neutral plane Na of a bending portion C of the organic EL display panel 30, in the folded state, of the organic EL display device 70a.

As illustrated in FIGS. 1 to 3, the organic EL display device 70a includes: a plate member (a joint) 40a; an organic EL display panel 30 provided on a front face (upper side in FIG. 1) of the plate member 40a; and a first support 51 and a second support 52 provided on a back face (lower side in FIG. 1) of the plate member 40a. Here, the rigidity of the plate member 40a (for example, approximately 11 N/mm) is higher than that of the organic EL display panel 30 (for example, approximately 8 N/mm).

As illustrated in FIG. 6, the organic EL display panel 30 includes: a base resin substrate layer 10; a stress adjusting layer 8 provided close to a back face (lower side in FIG. 6) of the base resin substrate layer 10; an organic EL element layer 20; a color filter 22; a counter resin substrate layer 23; a touch panel 25; and a hard coat layer 28. The organic EL element layer 20, the color filter 22, the counter resin substrate layer 23, the touch panel 25, and the hard coat layer 28 are provided in this stated order close to a front face (upper side in FIG. 6) of the base resin substrate layer 10. As illustrated in FIG. 5, a display region (not shown) of the organic EL display panel 30 has sub-pixels P arranged in matrix. As illustrated in FIG. 5, sub-pixels P having red light emission regions Lr for displaying gradation of a red color, sub-pixels P having green light emission regions Lg for displaying gradation of a green color, and sub-pixels P having blue light emission regions Lb for displaying gradation of a blue color are placed next to one another in the display region (not shown) of the organic EL display panel 30. Note that, in the display region of the organic EL display device 30, the three adjacent sub-pixels P each having one of the red light emission region Lr, the green light emission region Lg, and the blue light emission region Lb constitute one pixel. The organic EL display panel 30 is flexible. As illustrated in FIGS. 1 and 2, the organic EL display panel 30 includes: a pair of flat portions Fa and Fb held flat; and a bending portion C provided between the pair of the flat portions Fa and Fb, and held to be bendable. The size of the organic EL display panel 30 is, for example, approximately 10 cm in width (a longitudinal direction in FIG. 2), 18 cm in length (a lateral direction in FIG. 2), and 100 μm in thickness.

The base resin substrate layer 10 is made of, for example, polyimide resin and the like.

The stress adjusting layer 8 controls a position of the neutral plane Na, of the organic EL display device 30, under bending stress (see FIG. 10). Here, the stress adjustment layer 8 is, for example, a plastic film made of such a material as polyethylene terephthalate. As illustrated in FIG. 6, between the base resin substrate layer 10 and the stress adjustment layer 8, a first adhesive layer 9 made of, for example, epoxy resin adhesive, etc. is provided.

As illustrated in FIG. 7, the organic EL element layer 20 includes: multiple gate lines 11; multiple source lines 12a; and multiple power supply lines 12b. The multiple gate lines 11 are provided on the base resin substrate layer 10 (see FIG. 6) to extend parallel to one another in a lateral direction in FIG. 7. The multiple source lines 12a are provided on the base resin substrate layer 10 to extend parallel to one another in a longitudinal direction in FIG. 7. The multiple power supply lines 12b are provided on the base resin substrate layer 10 to be adjacent to the source lines 12a, and extend parallel to one another in the longitudinal direction in FIG. 7. A moisture-proof layer is provided between the base resin substrate layer 10 and a gate layer including such lines as the gate lines 11. The moisture-proof layer is configured as a single-layer film, such as a silicon nitride film, a silicon oxide film, or a silicon oxynitride film, or a multilayer film of two or more of these films.

As illustrated in FIG. 7, the organic EL element layer 20 further includes: multiple first TFTs 13a each provided for an associated one of the sub-pixels P; multiple second TFTs 13b each provided for an associated one of the sub-pixels P; and multiple capacitors 13c each provided for an associated one of the sub-pixels P. Here, as illustrated in FIG. 7, each of the first TFTs 13a is connected to the associated gate line 11 and source line 12a. As illustrated in FIG. 7, each of the second TFTs 13b is connected to the associated first TFT 13a and power supply line 12b. For example, the first TFTs 13a and the second TFTs 13b each include: a gate electrode provided on the base resin substrate layer 10 via the moisture-proof layer; a gate insulating film covering the gate electrode; a semiconductor layer provided on the gate insulating film to overlap the gate electrode; and source and drain electrodes provided on the semiconductor layer to face each other. As illustrated in FIG. 7, each of the capacitors 13c is connected to the associated first TFT 13a and power supply line 12b. For example, the capacitors 13c each include: a pair electrodes; and a gate insulating film provided between the pair of these electrodes. One of the two electrodes is made of the same material as that of the gate lines 11, and is formed in the same layer as that in the gate lines 11. The other one of the two electrodes is made of the same material as that of the source lines 12a, and is formed in the same layer as that in the source lines 12a. Note that, in this embodiment, the first TFTs 13a and the second TFTs 13b are, for example, bottom gate TFTs. Alternatively, the first TFTs 13a and the second TFTs 13b may be top gate TFTs.

As illustrated in FIG. 6, the organic EL element layer 20 further includes: an interlayer insulating film 14 substantially covers the first TFTs 13a (see FIG. 7), the second TFTs 13b, and the capacitors 13c (see FIG. 7); and multiple first electrodes 15 provided on the interlayer insulating film 14. Each of the first electrodes 15 is provided as an anode electrode for an associated one of the sub-pixels P, and connected to an associated one of the second TFTs 13b. Here, as illustrated in FIG. 6, the interlayer insulating film 14 covers each second TFT 13b, except for a portion of the drain electrode of the second TFT 13b. Note that the interlayer insulation film 14 is made of, for example, photosensitive acrylic resin and the like. The multiple first electrodes 15 are arranged in matrix on the interlayer insulating film 14 such that each first electrode 15 corresponds to an associated one of the sub-pixels P. As illustrated in FIG. 6, the first electrode 15 of each sub-pixel P is connected to the drain electrode of the associated second TFT 13b via an associated contact hole formed in the interlayer insulating film 14. The first electrodes 15 function to inject holes (positive holes) into an organic EL layer 17 to be described below. To increase the efficiency in injecting positive holes into the organic EL layer 17, the first electrodes 15 are preferably made of a material having a high work function. Examples of materials for the first electrodes 15 include metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), and ytterbium (Yb). The first electrodes 15 may also be made of an alloy of, for example, magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), or lithium fluoride (LiF)/calcium (Ca)/aluminum (Al). Furthermore, the material for the first electrodes 15 may also be a conductive oxide such as tin oxide ($SnO_2$), zinc oxide (ZnO), indium tin oxide (ITO), and indium zinc oxide (IZO), for example. Moreover, the first electrodes 15 may be multilayers containing the above materials, such as ITO/Ag, IZO/Ag, and IZO/Al. Examples of the materials having a high work function, out of conductive oxides include indium tin oxide (ITO) and indium zinc oxide (IZO).

As illustrated in FIG. 6, the organic EL element layer 20 further includes: an edge cover 16 formed in a grid pattern to cover peripheral portions of the first electrodes 15; and the organic EL layer 17 covering portions of the first electrodes 15 exposed from the edge cover 16. Examples of materials for the edge cover 16 include an inorganic film of silicon dioxide ($SiO_2$), silicon nitride (SiNx, where x is a positive number) such as trisilicon tetranitride ($Si_3N_4$), and silicon oxynitride (SiNO), and an organic film of (photosensitive) polyimide resin, (photosensitive) acrylic resin, (photosensitive) polysiloxane resin, and novolak resin. As illustrated in FIG. 8, the organic EL layer 17 includes: a positive hole injection layer 1; a positive hole transport layer 2; a light-emitting layer 3; an electron transport layer 4; and an electron injection layer 5, which are provided on the first electrodes 15 in this order.

The positive hole injection layer 1 is also called an anode buffer layer, and functions to bring the energy levels of the first electrodes 15 and the organic EL layer 17 close to each other and to increase efficiency in injection of positive holes from the first electrodes 15 into the organic EL layer 17. Here, examples of materials for the positive hole injection layer 1 include: triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The positive hole transport layer 2 functions to increase efficiency in transporting positive holes from the first electrodes 15 to the organic EL layer 17. Here, examples of materials for the positive hole transport layer 2 include porphyrin derivatives, aromatic tertiary amine compounds, styryl amine derivatives, polyvinylcarbazole, poly-p-phenylene vinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

When a voltage is applied from the first electrodes 15 and a second electrode 18 to be described below, the light-emitting layer 3 receives positive holes and electrons injected from the first and second electrodes 15 and 18. In the light-emitting layer 3, the positive holes and the electrons are recombined with each other. The light-emitting layer 3 is made of a material having high luminous efficiency. Examples of materials for the light-emitting layer 3 include metal oxinoid compounds (8-hydroxyquinoline metal complexes), naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bis(styryl) benzene derivatives, tris(styryl)benzene derivatives, perylene derivatives, perinone derivatives, aminopyrene derivatives, pyridine derivatives, rodamine derivatives, acridine derivatives, phenoxazone, quinacridone derivatives, rubrene, poly-p-phenylene vinylene, and polysilane.

The electron transport layer 4 functions to efficiently move electrons to the light-emitting layer 3. Here, examples of materials for the electron transport layer 4 includes, as organic compounds, oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron injection layer 5 functions to bring the energy levels of the second electrode 18 and the organic EL layer 17 close to each other, and to increase efficiency in injecting electrons from the second electrode 18 into the organic EL layer 17. This function contributes to reduction in the drive voltage of the organic EL element layer 20. The electron injection layer 5 may also be called a cathode buffer layer. Here, examples of materials for the electron injection layer 5 include inorganic alkaline compounds such as lithium fluoride (LiF), magnesium fluoride ($MgF_2$), calcium fluoride (CaF$_2$), strontium fluoride (SrF$_2$), and barium fluoride (BaF$_2$), aluminum oxide (Al$_2$O$_3$), and strontium oxide (SrO).

As illustrated in FIG. 6, the organic EL element layer 20 further includes: the second electrode 18 provided as a cathode electrode to cover the organic EL layer 17 and the edge cover 16; and a sealing film 19 covering the second electrode 18. Here, the second electrode 18 functions to inject electrons into the organic EL layer 17. To increase efficiency in injecting electrons into the organic EL layer 17, the second electrode 18 is preferably made of a material having a low work function. Examples of materials for the second electrode 18 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), and ytterbium (Yb). The second electrode 18 may also be made of, for example, an alloy of magnesium (Mg)/copper (Cu), magnesium (Mg)/silver (Ag), sodium (Na)/potassium (K), astatine (At)/astatine dioxide (AtO$_2$), lithium (Li)/aluminum (Al), lithium (Li)/calcium (Ca)/aluminum (Al), and lithium fluoride (LiF)/calcium (Ca)/aluminum (Al). The second electrode 18 may also be made of, for example, a conductive oxide such as tin oxide (SnO), zinc oxide (ZnO), indium tin oxide (ITO), and indium zinc oxide (IZO). Moreover, the second electrode 18 may be multilayers containing the above materials, such as ITO/Ag. Examples of materials having a low work function include magnesium (Mg), lithium (Li), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al). The sealing film 19 functions to protect the organic EL layer 17 against moisture and oxygen. Examples of materials for the sealing film 19 include inorganic materials such as silicon dioxide (SiO$_2$), aluminum oxide (Al$_2$O$_3$), silicon nitride (SiNx, where x is a positive number) such as trisilicon tetranitride (Si$_3$N$_4$), and silicon carbonitride (SiCN), and organic materials such as acrylate, polyurea, parylene, polyimide, and polyamide.

The color filter 22 includes, for example, a black matrix layer formed in a grid pattern, multiple color resist layers, such as a red layer, a green layer, and a blue layer, each provided to an associated one of sub-pixels P, and an overcoat layer covering the black matrix layer and the color resist layers. As illustrated in FIG. 6, between the organic EL element layer 20 and the color filter 22, a second adhesive layer 21 made of, for example, UV delay-curing adhesive and the like is provided. The color filter 22 is formed on the counter resin substrate layer 23.

The counter resin substrate layer 23 is made of, for example, polyimide resin and the like.

The touch panel 25 includes, for example, a base film and a capacitive touch panel layer provided on the base film. As illustrated in FIG. 6, between the counter resin substrate layer 23 and the touch panel 25, a third adhesive layer 24 made of, for example, epoxy resin adhesive and the like is provided.

The hard coat layer 28 is made of, for example, a UV curable organosilicon resin and the like. As illustrated in FIG. 6, the hard coat layer 28 is formed on a hard coat substrate 27 including a plastic film made of, for example, polyethylene terephthalate and the like. As illustrated in FIG. 6, between the touch panel 25 and the hard coat substrate 27, a fourth adhesive layer 26 made of, for example, epoxy resin adhesive and the like is provided.

The organic EL display panel 30 in the above configuration functions as follows: in each of the sub-pixels P, a gate signal is input through the gate line 11 to the first TFT 13a to turn the first TFT 13a on, a predetermined voltage corresponding to a source signal is written through the source line 12a into the gate electrode of the second TFT 13b and the capacitor 13c, and the magnitude of a current from the power supply line 12b is determined based on the gate voltage of the second TFT 13b. The determined current is supplied to the light-emitting layer 3 so that the light-emitting layer 3 emits light, thereby displaying an image. In the organic EL display device 30, even if the first TFT 13a is turned off, the gate voltage of the second TFT 13b is retained by the capacitor 13c. Thus, the light-emitting layer 3 keeps emitting light until the first TFT 13a receives a gate signal in a subsequent frame.

As illustrated in FIG. 1, the first support 51 supports one of the flat portions in a flat state; namely the flat portion Fa, of the organic EL display panel 30. Moreover, as illustrated in FIG. 1, the second support 52 supports the other of the flat portions in a flat state; namely the flat portion Fb, of the organic EL display panel 30. Here, the first support 51 and the second support 52 have rigidity. Examples of the first support 51 and the second support 52 are made of rigid materials. The rigid materials include metal plates such as an aluminum plate or a stainless steel plate having a thickness ranging from 1 millimeter to several millimeters, or resin plates made of such materials as acrylonitrile-butadiene-styrene copolymer (ABS) resin, polystyrene (PS) resin, and polycarbonate (PC) resin. In addition, the first support 51 and the second support 52 may be provided with, for example, a rib structure adding rigidity to the first and second supports 51 and 52.

As illustrated in FIG. 1, the plate member 40a is a joint joining the first support 51 and the second support 52 together. The plate member 40a does not overlap with the bending portion C of the organic EL display panel 30, so that the plate member 40a is provided not to interfere with bending portion C. Moreover, as illustrated in FIG. 1, the plate member 40a is provided between, and bonded to, (i) a pair of the flat portions Fa and Fb of the organic EL display panel 30 and (ii) the first and second supports 51 and 52. In addition, as illustrated in FIGS. 1 to 3, the plate member 40a is provided with an opening 41a corresponding to the bending portion C of the organic EL display panel 30. The opening 41a is a through opening in the thickness direction of the plate member 40a, and shaped into a rectangle in plan view. The width of the opening 41a is approximately 10 mm (about 5 mm on each side) wider than the width of the organic EL display panel 30, and the length of the opening is the same as the length of the bending portion C (for example, approximately 9.4 mm with a curvature radius of 3 mm). Here, the plate member 40a is flexible, and made of, for example, an Ni—Ti superelastic alloy and the like having a thickness of approximately 100 μm. Note that the superelastic alloy has a characteristic called "superelasticity." The superelasticity is a characteristic showing resistance against plastic deformation even if large strain is applied. In other words, even if bent or stretched, the superelastic alloy is immediately recovered to have the original shape when the bending or stretching force is released; that is, the superelastic alloy is elastic as rubber. In this embodiment, the plate member 40a described as an example is of a single-layer structure. Alternatively, the plate member 40a may be of a three-layer structure as illustrated in FIG. 4.

Specifically, as illustrated in FIG. 4, the plate member 40e includes, for example, a back face layer (a third layer) 6a made of a superelastic alloy having a thickness of approximately 40 μm, an intermediate layer (a first layer) 7 provided on the back face layer 6a and made of an inorganic film (for example, a silicon nitride film and the like) having a thickness of approximately 20 μm, and a surface layer (a second layer) 6b provided on the intermediate layer 7 and made of a superelastic alloy having a thickness of approximately 40 μm. Here, the relationship rigidity=cross-sectional area×Young's modulus/length holds. In order to increase the rigidity of the plate member, the cross-sectional area of the plate member may be increased; whereas if the plate member is made thicker, strain inevitably increases, and if the plate member is made wider, the width of a frame region around the display area inevitably increases. In addition, a material having a high Young's modulus is likely to cause brittle fracture such that even a small strain would break the plate member. Therefore, in the plate member 40e, the intermediate layer 7 made of a brittle material having a high Young's modulus (300 GPa) is formed to be relatively thin, and the back face layer 6a and the surface layer 6b, made of a superelastic alloy sandwiching the intermediate layer 7, are formed to be relatively thick. Such a structure makes it possible to reduce the brittle fracture and achieve, for example, a high rigidity of approximately 24 N/mm.

The organic EL display device 70a having the above configuration is accommodated in, for example, a pair of housings 61 and 62 joined by a hinge mechanism 63. The organic EL display device 70a can transform into (i) an open state (see FIGS. 1 to 3) in which the flat portion Fa, the bending portion C, and the other flat portion Fb are arranged in a single plane, and (ii) a folded state (FIG. 9) in which the bending portion C bends so that the pair of the flat portions Fa and Fb face each other. Here, since the neutral plane Na of the bending portion C is as long as the neutral plane Nb, of the plate member 40a, corresponding to the bending portion C. In the folded state, as illustrated in FIG. 10, the bending portion C protrudes from the opening 41a of the plate member 40a, so that the bending portion C of the organic EL display panel 30 does not interfere with the plate member 40a.

Note that, in this embodiment, the plate member 40a has a single opening portion 41a formed to correspond to the bending portion C as an example. Alternatively, the plate member may have multiple openings to have multiple bending portions, or the plate member may have multiple openings formed side by side to form a single bending portion.

As can be seen, the organic EL display device 70a of this embodiment can provide the following advantages.

(1) The first support 51 supporting one flat portion Fa of the organic EL display panel 30 and the second support 52 supporting the other flat portion Fb of the organic EL display panel 30 are joined together by the plate member 40a made of a superelastic alloy provided so as not to interfere with the bending portion C outside the bending portion C. Hence, without relying on the hinge mechanism 63, the plate member 40a can maintain the positional relationship between the pair of the flat portions Fa and Fb parallel with each other. Such a feature reduces the risk of twisting the bending portion C provided between the pair of the flat portions Fa and Fb, contributing to curbing creation of wrinkles in the bending portion C of the organic EL display panel 30. Furthermore, since the plate member 40a is higher in rigidity than the organic EL display panel 30, the stretch of the organic EL display panel 30 is restricted by the plate member 40a. Such a feature further contributes to curbing creation of wrinkles in the bending portion C of the organic EL display panel 30.

(2) The opening 41a is formed in the plate member 40a so that the organic EL display device 30 does not interfere with the plate member 40a when the organic EL display device 70a is in the folded state. Such a feature contributes to reducing the buckling of the bending portion C of the organic EL display device 30.

Second Embodiment

Figure 11:
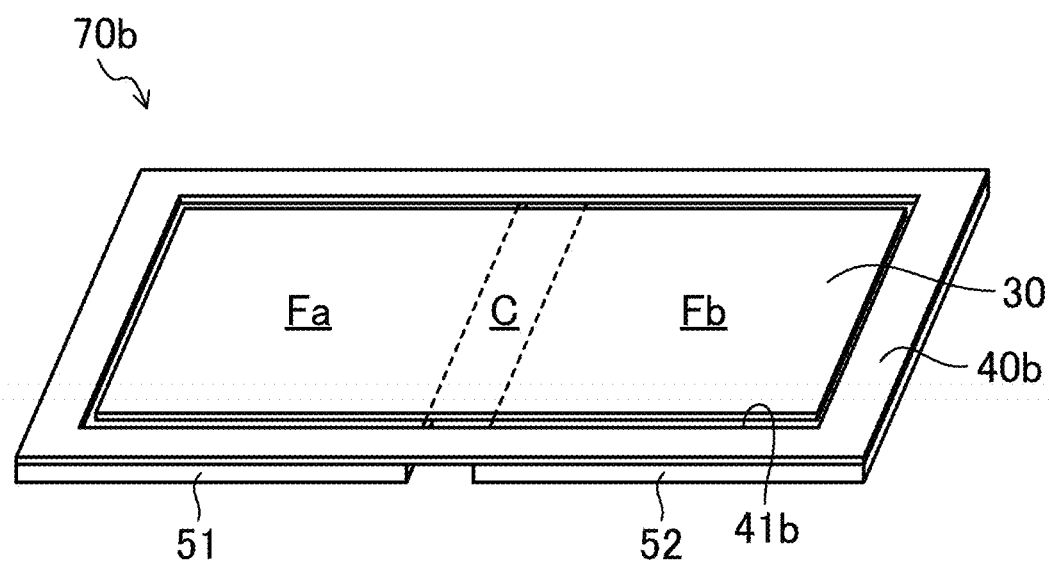
FIG. 11 is a perspective view of an organic EL display device in an open state according to a second embodiment of the present invention.
Figure 12:
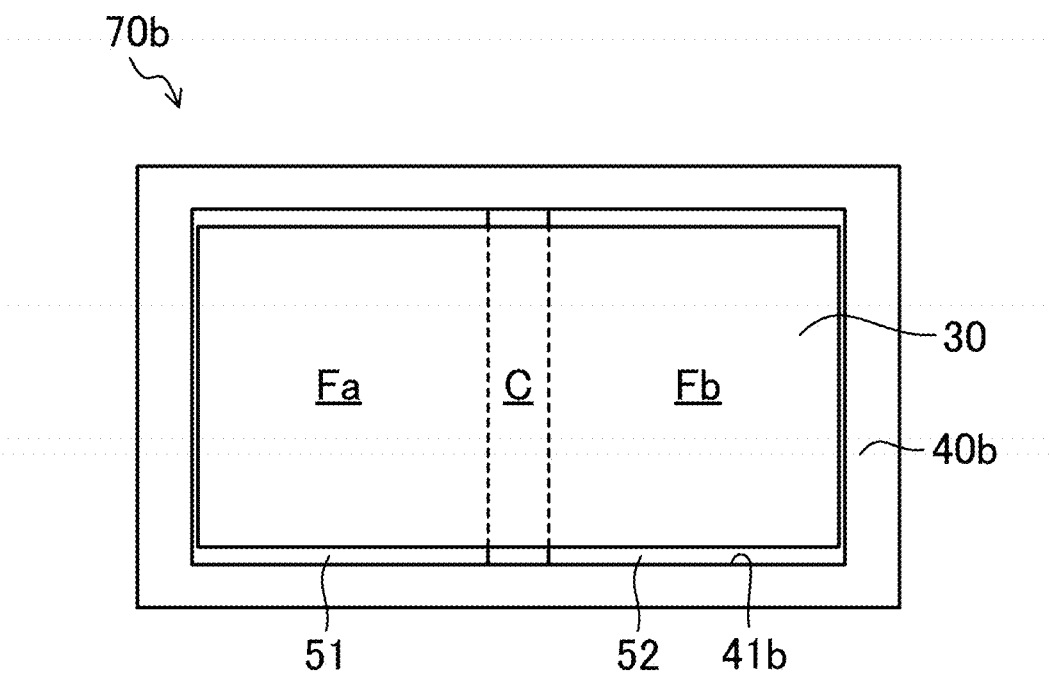
FIG. 12 is a top view of the organic EL display device in the open state according to the second embodiment of the present invention.
Figure 13:
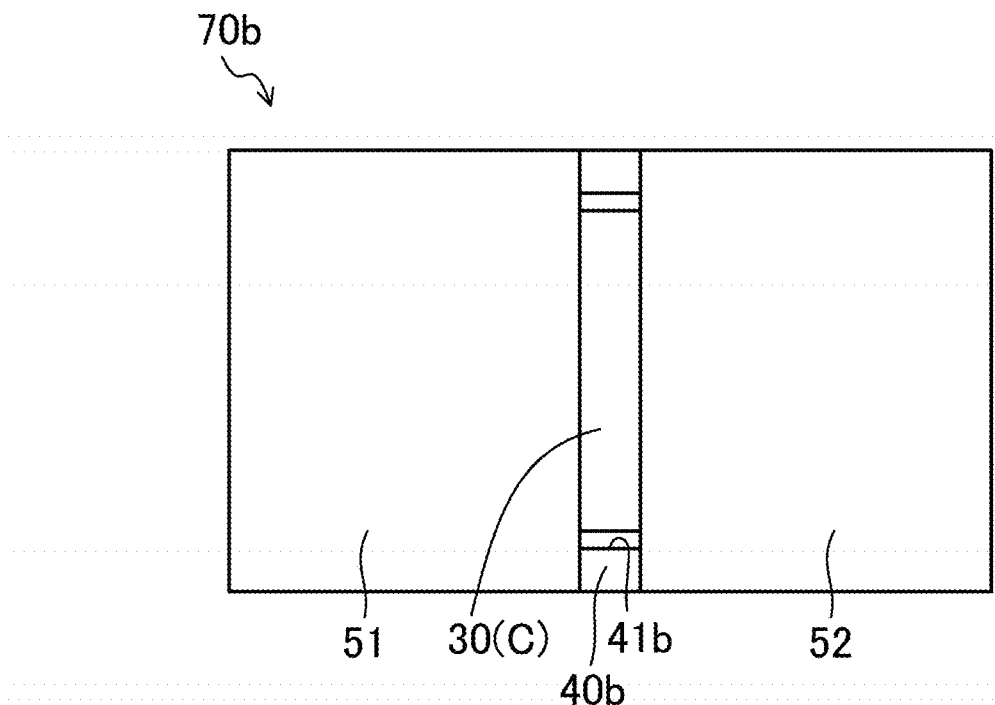
FIG. 13 is a bottom view of the organic EL display device in the open state according to the second embodiment of the present invention.
Figure 14:
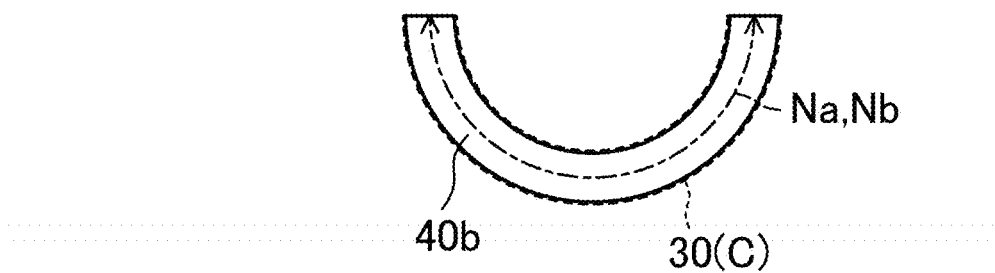
FIG. 14 is a side view explaining a neutral plane of a bending portion of the organic EL display panel, in a folded state, of the organic EL display device according to the second embodiment of the present invention.
Figure 15:
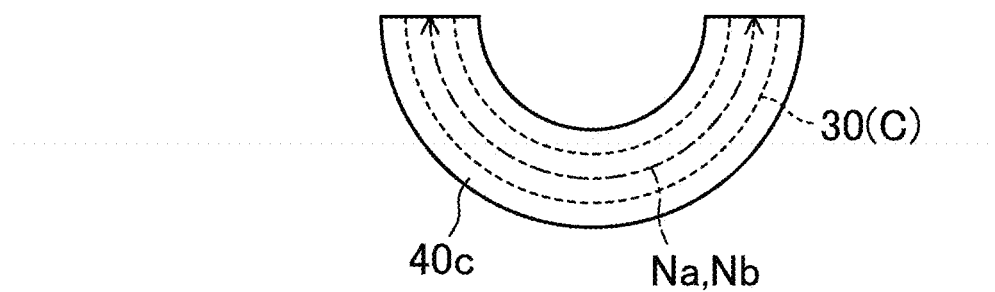
FIG. 15 is a side view explaining the neutral plane of the bending portion of the organic EL display panel, in the folded state, of a modification of the organic EL display device according to the second embodiment of the present invention.

FIGS. 11 to 15 illustrate an organic EL display device according to a second embodiment of the present invention. FIGS. 11, 12, and 13 are a perspective view, a top view, and a bottom view of an organic EL display device 70b, in an open state, of this embodiment. FIG. 14 is a side view explaining the neutral plane Na of the bending portion C of the organic EL display panel 30, in the folded state, of the organic EL display device 70b. FIG. 15 is a side view explaining the neutral plane Na of the bending portion C of the organic EL display panel 30, in the folded state, of a modification of the organic EL display device 70b. In the embodiments below, components equivalent to those illustrated in FIGS. 1 to 10 are denoted by the same reference characters, and the detailed explanation thereof will be omitted.

As illustrated in FIGS. 11 to 13, the organic EL display device 70b includes: a frame member 40b; the organic EL display panel 30 provided within the frame member 40b; and the first and second supports 51 and 52 provided on a back face (lower side in FIG. 11) of the frame member 40b.

As illustrated in FIG. 11, the frame member 40b is provided as a joint joining the first support 51 and the second support 52 together. The frame member 40b does not overlap with the bending portion C of the organic EL display panel 30 so that the frame member 40b does not to interfere with bending portion C. Furthermore, the frame member 40b is bonded to the first and second supports 51 and 52. In addition, as illustrated in FIGS. 11 to 13, the frame member 40b has an opening 41b formed to surround the organic EL display panel 30 in plan view. The opening 41b is a through opening in the thickness direction of the frame member 40b, and shaped into a rectangle in plan view. The opening 41b is formed to be larger by approximately 0.5 mm at each side than the organic EL display panel 30. Here, the frame member 40b is flexible, and made of, for example, an Ni—Ti superelastic alloy and the like having a thickness of approximately 100 μm.

The organic EL display device 70b having the above configuration is accommodated in, for example, a pair of housings joined by a hinge mechanism. The organic EL display device 70b can transform into (i) an open state (see FIGS. 11 to 13) in which the flat portion Fa, the bending portion C, and the other flat portion Fb are arranged in a single plane, and (ii) a folded state in which the bending portion C bends so that the pair of the flat portions Fa and Fb face each other. Here, since the organic EL display panel 30 is substantially as thick as the frame member 40b, as illustrated in FIG. 14, the neutral plane Na of the bending portion C overlaps with the neutral plane Nb of a portion of the frame member 40b corresponding to the bending portion C such that the neutral plane Na and the neutral plane Nb are substantially in the same position when viewed in a direction of the bending axis (in a direction perpendicular to the drawing plane). Note that, in the organic EL display device 70a of the first embodiment, the neutral plane Na of the bending portion C and the neutral plane Nb of the portion of the plate member 40a corresponding to the bending portion C are in different positions (see FIG. 10).

In this embodiment, for example, the organic EL display panel 30 is the same in thickness as the frame member 40b. Alternatively, the organic EL display panel and the frame member may have thicknesses illustrated in FIG. 15. Specifically, as illustrated in FIG. 15, a frame member 40c may be thicker (e.g., approximately 150 µm in thickness) than the organic EL display panel 30 (approximately 100 µm in thickness as described above), and the neutral plane Nb of the frame member 40c and the neutral plane Na of the organic EL display panel 30 may substantially be in the same position.

As can be seen, the organic EL display device 70b of this embodiment can provide the advantages below, as well as the above described advantage (1).

As to the advantage (1), the first support 51 supporting one flat portion Fa of the organic EL display panel 30 and the second support 52 supporting the other flat portion Fb of the organic EL display panel 30 are joined together by the frame member 40b made of a superelastic alloy provided so as not to interfere with the bending portion C of the organic EL display panel 30 outside the bending portion C. Hence, without relying on the hinge mechanism, the frame member 40b can maintain the positional relationship between the pair of the flat portions Fa and Fb parallel with each other. Such a feature reduces the risk of twisting the bending portion C provided between the pair of the flat portions Fa and Fb, contributing to curbing creation of wrinkles in the bending portion C of the organic EL display panel 30.

(3) Since the organic EL display panel 30 is the same in thickness as the frame member 40b, when the organic EL display device 70b is in the folded state, the neutral plane Na of the bending portion C and the neutral plane Nb of a portion of the frame member 40b corresponding to the bending portion C are substantially in the same position. When the organic EL display device 70b is in the folded state, such a feature allows a curvature of the bending portion C and a curvature of a portion of the frame member 40b corresponding to the bending portion C to coincide with each other, contributing to reducing protrusion of the bending portion C of the organic EL display panel 30 in relation to the frame member 40b.

(4) When the frame member 40c is thicker than the organic EL display panel 30, and the neutral plane Nb of the frame member 40c and the neutral plane Na of the organic EL display panel 30 are in the same position, the surface of the organic EL display panel 30 is positioned below the surface of the frame member 40c. Such a feature contributes to protecting the surface of the organic EL display panel 30.

Third Embodiment

Figure 16:
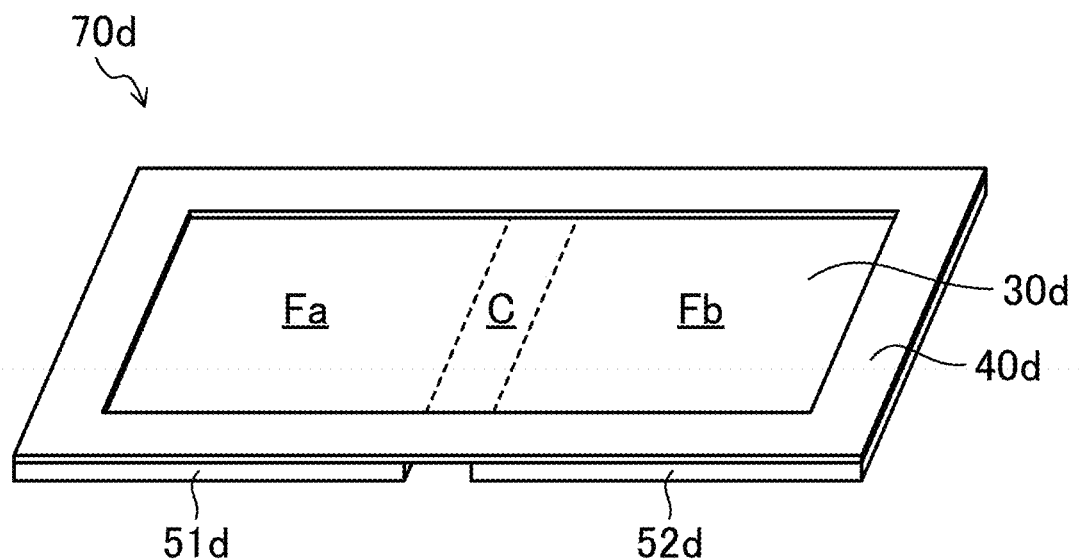
FIG. 16 is a perspective view of an organic EL display device in an open state according to a third embodiment of the present invention.
Figure 17:
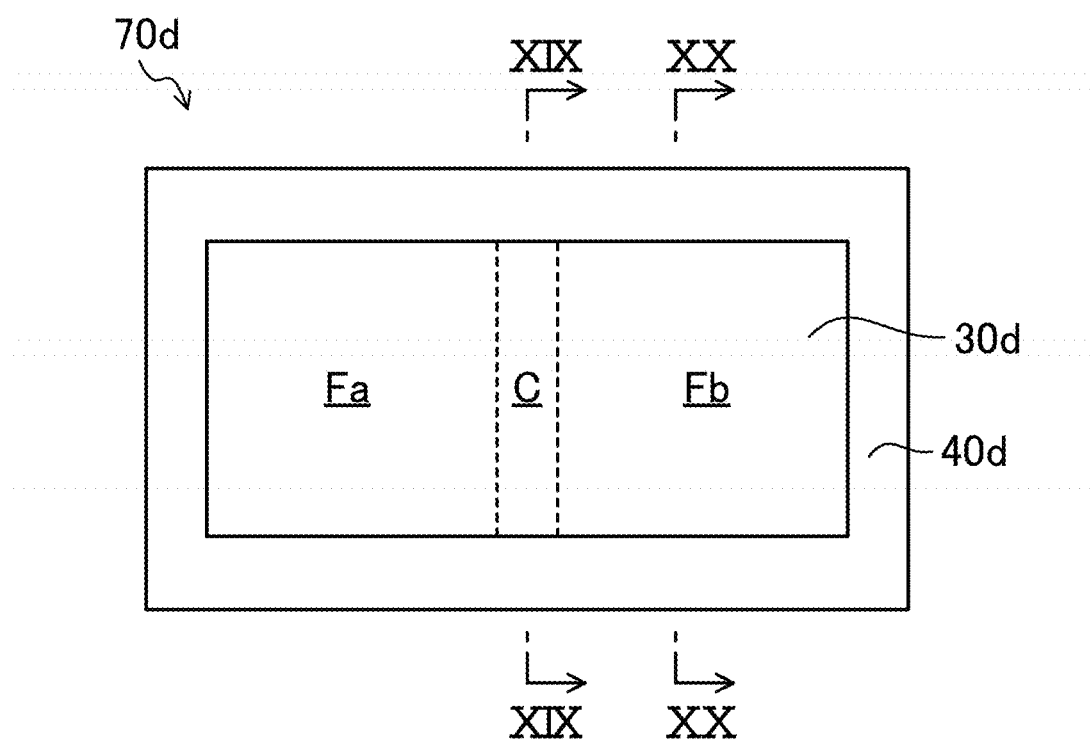
FIG. 17 is a top view of the organic EL display device in the open state according to the third embodiment of the present invention.
Figure 18:
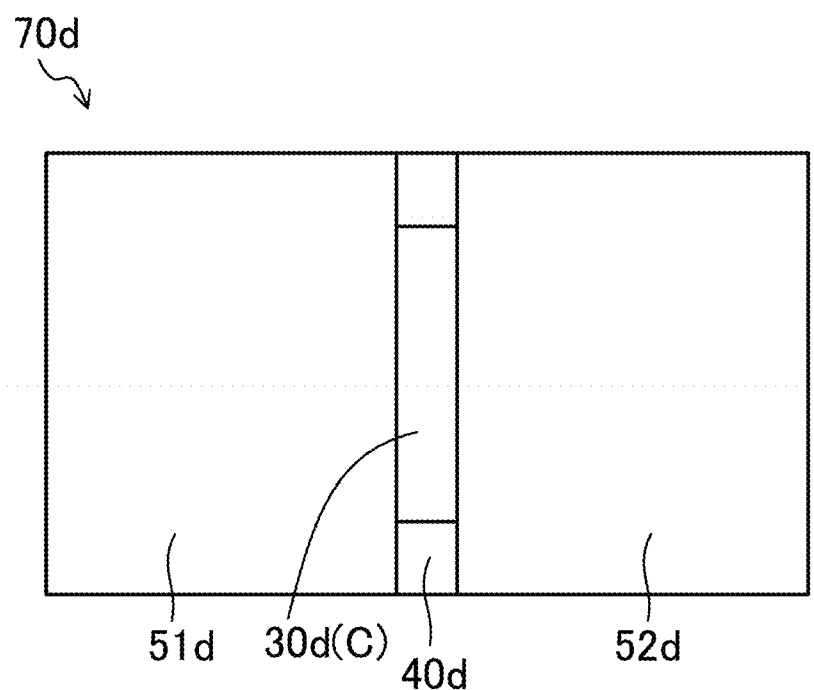
FIG. 18 is a bottom view of the organic EL display device in the open state according to the third embodiment of the present invention.
Figure 19:
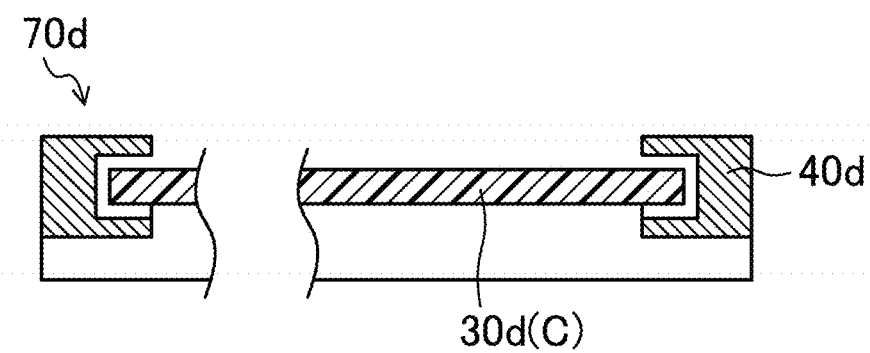
FIG. 19 is a cross-sectional view of the organic EL display device taken along line XIX-XIX of FIG. 17.
Figure 20:
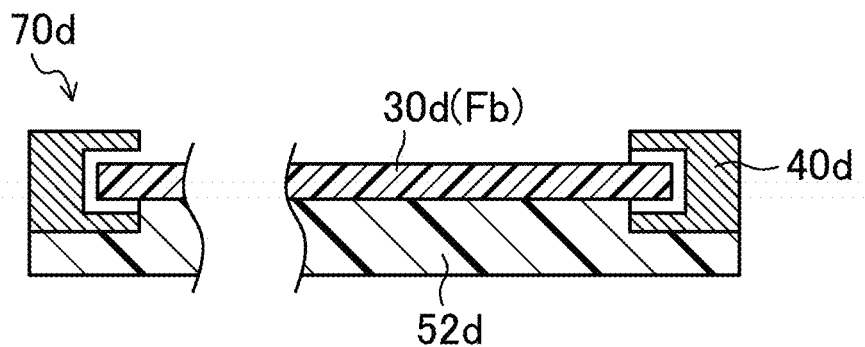
FIG. 20 is a cross-sectional view of the organic EL display device taken along line XX-XX of FIG. 17.
Figure 21:
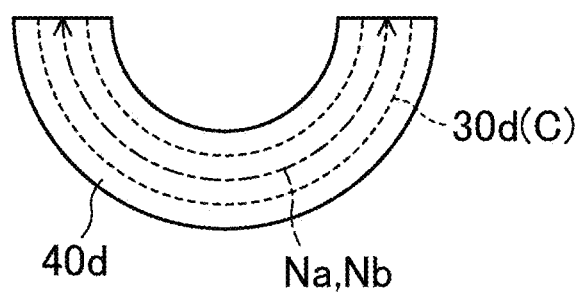
FIG. 21 is a side view explaining a neutral plane of a bending portion of the organic EL display panel, in a folded state, of the organic EL display device according to the third embodiment of the present invention.
Figure 22:
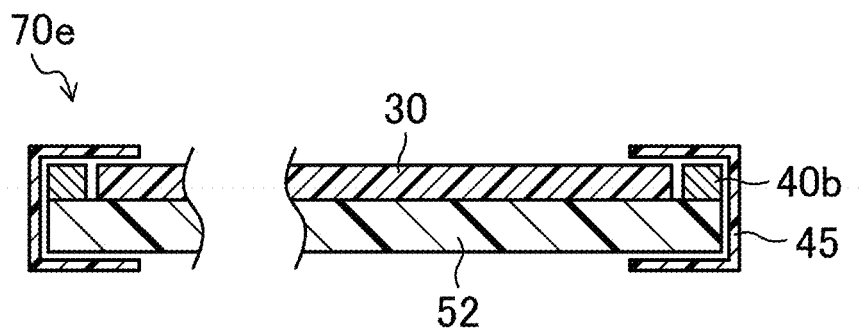
FIG. 22, corresponding to FIG. 20, is a cross-sectional view of a modification of the organic EL display device according to the third embodiment of the present invention.

FIGS. 16 to 22 illustrate an organic EL display device according to a third embodiment of the present invention. FIGS. 16, 17, and 18 are a perspective view, a top view, and a bottom view of an organic EL display device 70d, in an open state, of this embodiment. FIGS. 19 and 20 are cross-sectional views of the organic EL display device 70d taken along lines XIX-XIX and XX-XX illustrated in FIG. 17. FIG. 21 is a side view explaining the neutral plane Na of the bending portion C of the organic EL display panel 30, in the folded state, of the organic EL display device 70d. FIG. 22 is a cross-sectional view of an organic EL display device 70e which is a modification of the organic EL display device 70d. FIG. 22 corresponds to FIG. 20.

As illustrated in FIGS. 16 to 18, the organic EL display device 70d includes: a frame member 40d; an organic EL display panel 30d provided within the frame member 40d; and a first support 51d and a second support 52d provided on a back face (lower side in FIG. 15) of the frame member 40d.

The organic EL display panel 30d is the organic EL display panel 30 of the first embodiment made thinner to approximately 50 µm in thickness.

As illustrated in FIGS. 16 to 18, and 20, the frame member 40d is provided as a joint joining together the first support 51d and the second support 52d not to interfere with bending portion C of the organic EL display panel 30d. Furthermore, the frame member 40d is bonded to the first and second supports 51d and 52d. As illustrated in FIGS. 19 and 20, the frame member 40d has a U-shaped cross-section opened inward to accommodate a peripheral end (e.g., a portion of approximately 2 mm from an edge of the panel) of the organic EL display panel 30, and not to interfere with the bending portion C of the organic EL display panel 30d. Moreover, the frame member 40d is flexible, and made of, for example, an Ni—Ti superelastic alloy and the like having a thickness of approximately 160 µm. Here, the frame member 40d has, in the center along the thickness thereof, a groove with a width of approximately 80 µm to accommodate the peripheral end of the organic EL display panel 30d with a thickness of approximately 50 µm. Thus, the frame member 40d has the U-shaped cross-section. Hence, the frame member 40d is thicker than the organic EL display panel 30d, and the neutral plane Nb of the frame member 40d and the neutral plane Na of the organic EL display panel 30d are substantially in the same position. In order to accommodate the peripheral end of the organic EL display panel 30d, the frame member 40d is formed in advance to be divided into at least two members along the periphery of the frame member 40d. After accommodating the organic EL display panel 30d, the divided members are integrated into one piece to form the frame member 40d.

The organic EL display device 70d having the above configuration is accommodated in, for example, a pair of housings joined by a hinge mechanism. The organic EL display device 70d can transform into (i) an open state (see FIGS. 16 to 18) in which the flat portion Fa, the bending portion C, and the other flat portion Fb are arranged in a single plane, and (ii) a folded state in which the bending portion C bends so that the pair of the flat portions Fa and Fb face each other.

Note that in this embodiment, described as an example is the organic EL display device 70d including the frame member 40d accommodating the peripheral end of the organic EL display device 30d. Alternatively, described as an example may be the organic EL display device 70e including a resin frame 45 accommodating the peripheral end of the organic EL display panel 30. Specifically, as illustrated in FIG. 22, the organic EL display device 70e accommodates, in the resin frame 45, the peripheral edge of the organic EL display device 70b of the second embodiment. As illustrated in FIG. 22, the resin frame 45 has a U-shaped cross-section opened inward to accommodate all of the frame member 40b and the peripheral end of the organic EL display panel 30. For example, the resin frame 45 is made of silicone resin and the like.

Moreover, in the second and third embodiments, the frame member 40b (40c) and the frame member 40d are exemplified as a joint to join the first and second supports together. Alternatively, the joint may be a pair of straps arranged parallel to each other to join the first and second supports together.

As can be seen, the organic EL display device 70*d* of this embodiment can provide the advantages below, as well as the above described advantage (1).

As to the advantage (1), the first support 51*d* supporting one flat portion Fa of the organic EL display panel 30*d* and the second support 52*d* supporting the other flat portion Fb of the organic EL display panel 30*d* are joined together by the frame member 40*d* made of a superelastic alloy provided so as not to interfere with the bending portion C of the organic EL display panel 30*d*. Hence, without relying on the hinge mechanism, the frame member 40*d* can maintain the positional relationship between the pair of the flat portions Fa and Fb parallel with each other. Such a feature reduces the risk of twisting the bending portion C provided between the pair of the flat portions Fa and Fb, contributing to curbing creation of wrinkles in the bending portion C of the organic EL display panel 30*d*.

(5) Since the frame member 40*d* is thicker than the organic EL display panel 30*d*, and the neutral plane Nb of the frame member 40*d* and the neutral plane Na of the organic EL display panel 30*d* are in the same position, the surface of the organic EL display panel 30*d* is positioned below the surface of the frame member 40*d*. Such a feature contributes to protecting the surface of the organic EL display panel 30*d*. Moreover, since the neutral plane Na of the bending portion C and the neutral plane Nb of a portion of the frame member 40*d* corresponding to the bending portion C are in the same position, the curvature of the bending portion C and the curvature of a portion of the frame member 40*b* corresponding to the bending portion C coincide with each other when the organic EL display device 70*d* is in the folded state, contributing to reducing protrusion of the bending portion C of the organic EL display panel 30*d* in relation to the frame member 40*d*.

(6) The peripheral end of the organic EL display panel 30*d* is accommodated in the frame member 40*d*. Such a feature makes it possible to reduce the risk of delamination of a surface layer (e.g., the hard coat layer 28) from a panel end face in the organic EL display panel 30*d*. The peripheral end of the organic EL display panel 30*d* is accommodated in the frame member 40*d*. Such a feature makes it possible to reduce the risk of delamination of the organic EL display panel 30*d* from the first and second supports 51*d* and 52*d*. The peripheral end of the organic EL display panel 30*d* is accommodated in the frame member 40*d*. Such a feature makes it possible to reduce the risk of damage such as wrinkles and tears even if the panel end of the bending portion C receives an impact.

(7) In the organic EL display device 70*e* including the resin frame 45, the peripheral end of the organic EL display panel 30 is accommodated in the resin frame 45. Such a feature makes it possible to reduce the risk of delamination of a surface layer (e.g., the hard coat layer 28) from a panel end face in the organic EL display panel 30.

Other Embodiments

In each of the above embodiments, described as an example is an organic EL display device including an organic EL display panel. Instead, the present invention may be applied to a flexible display device not using organic EL elements, and a lighting apparatus including an organic EL panel.

In each of the above embodiments, described as an example is an organic EL display device whose organic EL display panel can bend inward. Instead, the present invention may be applied to an organic EL display device whose organic EL display panel can bend outward.

In each of the above embodiments, described as examples are the organic EL display devices 70*a*, 70*b*, 70*d*, and 70*e*. Instead, the present invention may be implemented with the combinations of the constitutional elements of the organic EL display devices 70*a*, 70*b*, 70*d*, and 70*e* changed in any given manners.

Moreover, in each of the above embodiments, described as an example is an organic EL layer having a stacked structure of the five layers, namely, the positive hole injection layer, the positive hole transport layer, the light-emitting layer, the electron transport layer, and the electron injection layer. Alternatively, the organic EL layer may have a stacked structure of three layers including a positive hole injection layer-transport layer, a light-emitting layer, and an electron transport layer-injection layer, for example.

In each of the above embodiments, described as an example is an organic EL display device in which the first electrode functions as the anode and the second electrode functions as the cathode. Alternatively, the present invention is applicable to an organic EL display device in which the stacked structure of the organic EL element is inverted, so that the first electrode functions as the cathode and the second electrode functions as the anode.

In each of the above embodiments, described as an example is the organic EL display device including the TFT having, as the drain electrode, an electrode connected to the first electrode. Alternatively, the present invention is applicable to an organic EL display device including the TFT having an electrode connected to the first electrode and called a source electrode.

INDUSTRIAL APPLICABILITY

As can be seen, the present invention is useful for a flexible organic EL display device.

DESCRIPTION OF REFERENCE CHARACTERS

C Bending Portion
Fa, Fb Flat Portion
Na, Nb Neutral Plane
6*a* Back Face Layer (Third Layer)
6*b* Surface Layer (Second Layer)
7 Intermediate Layer (First Layer)
30, 30*d* Organic EL Display Panel
40*a*, 40*e* Plate Member (Joint)
40*b*, 40*d* Frame Member (Joint)
41*a*, 41*b* Opening
45 Resin Frame
51, 51*d* First Support
52, 52*d* Second Support
63 Hinge Mechanism
70*a*, 70*b*, 70*d*, 70*e* Organic EL Display Device

The invention claimed is:

1. A display device comprising:
a display panel which is flexible, the display panel including a pair of flat portions held flat, and a bending portion provided between the pair of the flat portions and held to be bendable;
a first support supporting one of the pair of the flat portions in a flat state;
a second support supporting another one of the pair of the flat portions in a flat state; and
a joint joining the first support and the second support together, wherein the joint is flexible and provided not to interfere with the bending portion, and the joint is defined by a single monolithic plate member having an opening corresponding to the bending portion extending through the plate member, the plate member having a portion not having the opening and provided between (i) the pair of the flat portions and (ii) the first and second supports.

2. The display device of claim 1, wherein the joint is higher in rigidity than the display panel.

3. The display device of claim 1, wherein the pair of the flat portions is foldable by a hinge mechanism.

4. The display device of claim 1, wherein the joint is made of a superelastic alloy.

5. The display device of claim 1, wherein the joint includes a first layer made of an inorganic film, a second layer made of a superelastic alloy provided on one surface of the first layer, and a third layer made of a superelastic alloy provided on another surface of the first layer.

6. The display device of claim 1, wherein the display panel is an organic EL display panel.

7. The display device of claim 1, wherein the plate member includes an outer peripheral edge positioned outside of a peripheral edge of the display panel.

8. A display device comprising:
a display panel which is flexible, the display panel including a pair of flat portions held flat, and a bending portion provided between the pair of the flat portions and held to be bendable;
a first support supporting one of the pair of the flat portions in a flat state;
a second support supporting another one of the pair of the flat portions in a flat state; and
a joint joining the first support and the second support together, wherein
the joint is flexible and provided not to interfere with the bending portion,
the joint is defined by a single monolithic frame member having an opening formed to surround the display panel in plan view extending through the frame member, and
the frame member is as thick as the display panel.

9. The display device of claim 8, wherein a neutral plane of the frame member and a neutral plane of the display panel are in the same position.

10. The display device of claim 8, further comprising a resin frame having a U-shaped cross-section and opened inward to accommodate all of the frame member and a peripheral end of the display panel.

11. The display device of claim 8, wherein the joint is made of a superelastic alloy.

12. The display device of claim 8, wherein the joint includes a first layer made of an inorganic film, a second layer made of a superelastic alloy provided on one surface of the first layer, and a third layer made of a superelastic alloy provided on another surface of the first layer.

13. The display device of claim 8, wherein the display panel is an organic EL display panel.

14. The display device of claim 8, wherein the joint is defined by the frame member including an opening which surrounds the entire display panel in a single plane in the plan view.

\* \* \* \* \*